United States Patent [19]

Hosoda et al.

[11] Patent Number: 5,501,936
[45] Date of Patent: Mar. 26, 1996

[54] POSITIVE-WORKING QUINONEDIAZIDE PHOTORESIST COMPOSITION CONTAINING A CYCLOHEXYL-SUBSTITUTED TRIPHENYLMETHANE COMPOUND

[75] Inventors: Hiroshi Hosoda; Remi Numata; Kousuke Doi; Nobuo Tokutake; Hidekatsu Kohara; Toshimasa Nakayama, all of Kanagawa, Japan

[73] Assignee: Tokyo Ohka Kogyo Co., Ltd., Japan

[21] Appl. No.: 362,857

[22] Filed: Dec. 23, 1994

[30] Foreign Application Priority Data

Dec. 28, 1993 [JP] Japan .................................. 5-333936

[51] Int. Cl.$^6$ ...................................... G03F 7/023
[52] U.S. Cl. ..................... 430/191; 430/192; 430/193
[58] Field of Search ............................ 430/191, 192, 430/193

[56] References Cited

U.S. PATENT DOCUMENTS

| | | | |
|---|---|---|---|
| 4,738,915 | 4/1988 | Komine et al. | 430/191 |
| 5,112,719 | 5/1992 | Yamada et al. | 430/191 |
| 5,215,856 | 6/1993 | Jayaraman | 430/191 |
| 5,290,658 | 3/1994 | Uenishi et al. | 430/191 |
| 5,306,596 | 4/1994 | Oie et al. | 430/191 |

FOREIGN PATENT DOCUMENTS

| | | |
|---|---|---|
| 0358871A2 | 3/1990 | European Pat. Off. . |
| 3-200254 | 9/1991 | Japan . |
| 6-301204 | 10/1994 | Japan . |

*Primary Examiner*—Charles L. Bowers, Jr.
*Assistant Examiner*—Christopher G. Young
*Attorney, Agent, or Firm*—Wenderoth, Lind & Ponack

[57] ABSTRACT

An improved positive-working photoresist composition useful in the fine patterning work of a resist layer is proposed which is capable of giving a patterned resist layer having excellent resolution, heat resistance and orthogonality of the cross sectional profile of a line pattern with a high sensitivity to actinic rays and a wide range of the focusing depth. The photoresist composition comprises, as a uniform mixture in the form of a solution, (a) an alkali-soluble novolac resin, (b) a naphthoquinone-1,2-diazido group-containing compound as a photosensitizing ingredient and (c) a specific phenolic triphenyl methane compound substituted by cyclohexyl groups on two of the phenyl groups, such as bis(3-cyclohexyl-4-hydroxy-6-methylphenyl)-3,4-dihydroxyphenyl methane or bis(3-cyclohexyl-6-hydroxy-4-methylphenyl)-3,4-dihydroxyphenyl methane, in a specified amount.

11 Claims, No Drawings

POSITIVE-WORKING QUINONEDIAZIDE PHOTORESIST COMPOSITION CONTAINING A CYCLOHEXYL-SUBSTITUTED TRIPHENYLMETHANE COMPOUND

BACKGROUND OF THE INVENTION

The present invention relates to a novel positive-working photoresist composition or, more particularly, to a positive-working photoresist composition capable of forming an extremely fine pattern of the resist layer even on a substrate surface having level differences or having high reflectivity of light with high resolution and sensitivity as well as with a wide range of focusing depth and a large exposure dose latitude.

The technology of photolithographic patterning by using a photoresist composition to form a patterned resist layer is well established in the manufacture of fine electronic devices including semiconductor devices such as ICs, LSIs and the like and liquid crystal display panels. The photoresist compositions most widely under practical use include those alkali-developable positive-working ones comprising an alkali-soluble resin as a film-forming ingredient and a quinone diazido group-containing compound as a photosensitive ingredient. The above mentioned alkali-soluble resin as a film-forming ingredient is typically a novolac resin which is preferred due to the good developability behavior with rapid dissolution without swelling in an alkaline aqueous developer solution and high resistance against the attack of plasma and elevated temperatures in the course of the dry-etching treatment required for a patterned resist layer as an etching mask.

The quinonediazido group-containing compound as the photosensitive ingredient is unique because the compound inherently has an activity to suppress the solubility of the novolac resin in an aqueous medium while, when exposed to actinic rays including electromagnetic waves such as ultraviolet light of so-called g-line and i-line and far-ultraviolet light such as excimer laser beams as well as corpuscular beams such as electron beams as blended with a novolac resin, the compound has an effect of promoting the solubility of the novolac resin in an alkaline medium along with the alkali-solubility imparted to the compound per se. Accordingly, a large number of positive-working photoresist compositions comprising an alkali-soluble novolac resin and a quinonediazido group-containing compound to exhibit a great change in the solubility behavior by the irradiation with actinic rays, i.e. electromagnetic waves and corpuscular beams, suitable for practical use are disclosed in, for example, U.S. Pat. No. 4,377,631, Japanese Patent Kokai No. 62-35349, No. 1-142548 and No. 1-179147, Japanese Patent Publication No. 3-4897 and elsewhere.

It is a remarkable trend in recent years in the field of the electronic industry that the degree of integration in semiconductor devices or the fineness in the patterning of liquid crystal display panels is rapidly increasing. For example, extremely fine patterning of so-called sub-micron or half-micron order or even finer is required in the manufacturing process of VLSIs which cannot be achieved without improvements in the performance of the positive-working photoresist compositions used therein. Namely, a positive-working photoresist composition is required to have high sensitivity to actinic rays from the standpoint of productivity, a wide range of focusing depth in order to give a patterned resist layer with high fidelity to the mask pattern even on a substrate surface having level differences and also to be capable of giving a patterned resist layer of high resolution and an excellently orthogonal cross sectional profile of a line pattern having good heat resistance to withstand the heat treatment (post exposure bake) before development after exposure and resistance against plasma in dry etching.

Various additives have been proposed to a positive-working photoresist composition, by which the above described requirements could be satisfied though with respective problems and disadvantages. For example, Japanese Patent Kokai No. 61-141441 discloses a positive-working photoresist composition with admixture of a trihydroxy benzophenone compound although the resist composition is poor in the heat resistance if not without improvements in the sensitivity and developability. Further, Japanese Patent Kokai No. 2-275955, No. 3-200252 and No. 3-200254 propose positive-working photosensitive compositions containing specific trisphenol-based compounds to enhance resolution, sensitivity and heat-resistance. These photoresist compositions, however, are not quite satisfactory in respect of the pattern resolution which is the most important factor in order to ensure the accuracy in the ultrafine patterning work of the resist layer.

It would be a due idea that the desired improvement in the resolution of the patterned photoresist layer could be obtained by the improvements in the exposure machine. For example, a proposal is made for the use of an exposure lens having an increased numerical aperture but an increase in the numerical aperture of a lens is necessarily accompanied by a decrease in the range of the focusing depth so that such a measure is not practical when the substrate surface has a large level difference.

SUMMARY OF THE INVENTION

The present invention accordingly has an object, in view of the above described prior art situations, to provide a novel and improved positive-working photoresist composition capable of giving an extremely fine patterned resist layer with high resolution and high heat resistance and having an excellently orthogonal cross sectional profile of a line pattern with high sensitivity to actinic rays and wide range of focusing depth.

Thus, the present invention provides a novel and improved positive-working photoresist composition which comprises, as a uniform mixture:

(a) an alkali-soluble resin;
(b) a quinonedizide group-containing compound; and
(c) a cyclohexyl-substituted triphenylmethane compound represented by the general formula

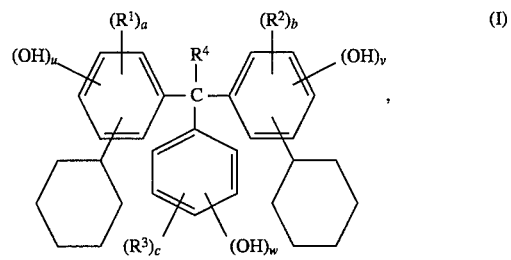

in which $R^1$, $R^2$ and $R^3$ are each a hydrogen atom, alkyl group having 1 to 3 carbon atoms or alkoxy group having 1 to 3 carbon atoms, $R^4$ is a hydrogen atom or alkyl group having 1 to 3 carbon atoms and the subscripts a, b, c, u, v and w are each 1, 2 or 3 with the provisos that a+u and b+v each do not exceed 4 and c+w does not exceed 5, in a specified amount, preferably, in the range from 5% to 50% by weight based on the amount of the component (a) in the composition.

In particular, the cyclohexyl groups are each bonded to the respective phenyl groups preferably at the 3-position, the subscripts a, b, u and v are each preferably 1 and the subscript w is preferably 2 for two hydroxy groups bonded to the 3- and 4-positions of the phenyl group.

DETAILED DESCRIPTION OF THE PREFERRED EMBODIMENTS

As is described above, the inventive positive-working photoresist composition comprises three essential ingredients including the components (a), (b) and (c), of which the most characteristic feature of the inventive composition is the addition of a cyclohexyl-substituted triphenylmethane compound represented by the general formula (I) as a unique additive in a specific amount.

The component (a) in the inventive photoresist composition is an alkali-soluble resin to serve as a film-forming ingredient which is not particularly limitative and can be selected without limitations from the alkali-soluble resins used in conventional positive-working photoresist compositions including the condensation products of an aromatic hydroxy compound such as phenol, cresol, xylenol and the like and an aldehyde such as formaldehyde and the like or a ketone such as acetone, polyhydroxystyrene and derivatives thereof and so on.

Examples of the above mentioned aromatic hydroxy compound include phenol, alkyl phenols such as m-, p- and o-cresols, 2,3-, 2,5-, 3,5- and 3,4-xylenols, 2-, 3- and 4-ethyl phenols, 2,3,5-trimethyl phenol, 2,3,5-triethyl phenol, 2-, 3- and 4-tert-butyl phenols, 2-tert-butyl-4-methyl phenol, 2-tert-butyl-5-methyl phenol, alkoxy phenols such as p- and m-methoxy phenols, p- and m-ethoxy phenols and p- and m-propoxy phenols, isopropenyl phenols such as o- and p-isopropenyl phenols, 2-methyl-4-isopropenyl phenol and 2-ethyl-4-isopropenyl phenol, aryl phenols such as 2-phenylphenol and polyhydroxy phenols such as dihydroxy biphenyl, bisphenol A, resorcinol, hydroquinone and pyrogallol, of which m- and p-cresols, 3,5-xylenols and 2,3,5-trimethyl phenol are particularly preferable. These aromatic hydroxy compounds can be used either singly or as a combination of two kinds or more according to need.

Examples of the aldehyde compound to pertain to the condensation reaction with the above described aromatic hydroxy compound include formaldehyde, paraformaldehyde, trioxane, acetaldehyde, propionaldehyde, butyraldehyde, trimethyl acetaldehyde, acrolein, crotonaldehyde, cyclohexane aldehyde, furrural, furyl acrolein, benzaldehyde, terephthalaldehyde, phenyl acetaldehyde, α- and β-phenyl propylaldehydes, o-, m- and p-hydroxy benzaldehydes, o-, m- and p-methyl benzaldehydes, o-, m- and p-chloro benzaldehydes and cinnamaldehyde, of which formaldehyde is preferred and, when an increased heat resistance is desired of the photoresist composition, hydroxy benzaldehydes are particularly preferable. These aldehyde compounds can be used either singly or as a combination of two kinds or more according to need.

Examples of the ketone compound as an alternative of the aldehyde compound to react with the aromatic hydroxy compound include acetone, methyl ethyl ketone, diethyl ketone, diphenyl ketone and the like either singly or as a combination of two kinds or more according to need. Acetone is particularly preferable when the aromatic hydroxy compound is pyrogallol.

The condensation reaction of an aromatic hydroxy compound and an aldehyde or ketone can be performed according to a known procedure in the presence of an acid as the catalyst. Examples of the acid suitable as the catalyst include hydrochloric acid, sulfuric acid, formic acid, acetic acid, oxalic acid and p-toluene sulfonic acid. The alkali-soluble resin obtained as the product of the condensation reaction is preferably freed from low-molecular fractions by undertaking a suitable fractionation treatment so that the resin is imparted with a further improved heat resistance. The fractionation treatment can be performed by the re-precipitation method in which the resin product obtained by the condensation reaction is dissolved in a good solvent therefor such as alcohols, e.g., methyl and ethyl alcohols, ketones, e.g., acetone and methyl ethyl ketone, ethyleneglycol monoethyl ether acetate, tetrahydrofuran and the like and the resin solution is added into a large volume of water so as to precipitate the resinous polymer of high molecular-weight fractions. The alkali-soluble resin as the component (a) in the inventive photoresist composition should have a weight-average molecular weight in the range from 2000 to 25000 or, preferably, from 2500 to 20000. The weight-average molecular weight implied above refers to the value obtained by the gel permeation chromatography with polystyrenes as the reference material.

The polyhydroxystyrene and derivatives thereof as an alternative of the above described condensation product of an aromatic hydroxy compound and an aldehyde or ketone include homopolymers of vinyl phenol and copolymers of vinyl phenol with a comonomer copolymerizable therewith. The comonomers copolymerizable with vinyl phenol include acrylic and methacrylic acids and esters thereof, acrylonitrile, meth-acrylonitrile, styrene, α-methyl styrene, p- and o-methyl styrenes, p-methoxy styrene and p-chloro styrene.

The second essential ingredient, i.e. component (b), in the inventive photoresist composition is a quinonediazide group containing compound to serve as a photosensitive ingredient. Examples of suitable compounds as the component (b) include a complete or partial esterification products of quinonediazido group-containing sulfonic acids such as a sulfonic acid of a quinonediazide compound, e.g., benzoquinonediazide, naphthoquinonediazide and anthraquinonediazide, as well as functional derivatives thereof such as sulfonyl chlorides, in particular, with a polyhydroxy compound to form an ester compound although amidation products of sulfonic acid derived from a quinonediazide compound with a polyamino compound can also be used as the component (b).

Examples of quinonediazido group containing organic sulfonic acids include naphthoquinone-1,2-diazide sulfonic acids such as naphthoquinone-1,2 -diazide-5-sulfonic acid, naphthoquinone-1,2-diazide-4-sulfonic acid, naphthoquinone- 1,2-diazide-6-sulfonic acid and the like, o-benzoquinone-diazide sulfonic acid, o-anthraquinonediazide sulfonic acid and the like.

The polyhydroxy compound as the esterification agent of the naphthoquinone diazide sulfonic acid compound includes those belonging to the following six classes.

Examples of suitable polyhydroxy compounds belonging to the first class include polyhydroxy benzophenone compounds such as 2,3,4-trihydroxy benzophenone, 2,4,4'-trihydroxy benzophenone, 2,4,6-trihydroxy benzophenone, 2,3,4,4'-tetrahydroxy benzophenone, 2,2',4 4'-tetrahydroxy benzophenone, 2,3',4 4',6-pentahydroxy benzophenone, 2,2', 3,4,4'-pentahydroxy benzophenone, 2,2',3,4,5'-pentahydroxy benzophenone, 2,3',4,5,5'-pentahydroxy benzophenone, 2,3,3',4,4',5-hexahydroxy benzophenone and the like.

Examples of suitable polyhydroxy compounds belonging to the second class include those compounds represented by the general formula

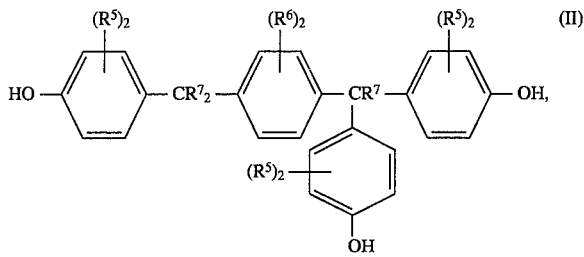

in which each $R^5$ is, independently from the others, a hydrogen atom, halogen atom, hydroxy group, alkyl group having 1 to 4 carbon atoms or alkenyl group having 2 to 4 carbon atoms, each $R^6$ is, independently from the other, a hydrogen atom, halogen atom or alkyl group having 1 to 4 carbon atoms and $R^7$ is a hydrogen atom or alkyl group having 1 to 4 carbon atoms, such as 1-[1]-(4-hydroxyphenyl) isopropyl]-4-[ 1,1-bis(4-hydroxyphenyl) ethyl] benzene and the like.

Examples of suitable polyhydroxy compounds belonging to the third class include tris(hydroxyphenyl) methane compounds represented by the general formula

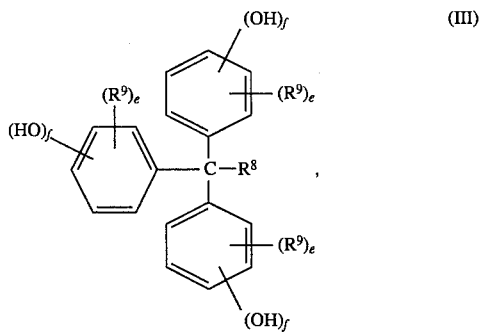

in which $R^8$ is a hydrogen atom or alkyl group having 1 to 4 carbon atoms, each $R^9$ is, independently from the others, a hydrogen atom, halogen atom, alkyl group having 1 to 4 carbon atoms or alkoxy group having 1 to 4 carbon atoms, the subscript e is 1 or 2 and the subscript f is 1, 2 or 3 with the proviso that e+f does not exceed 5, such as tris(4-hydroxyphenyl) methane, bis(4-hydroxy-3,5-dimethylphenyl)- 4-hydroxyphenyl methane, bis(4-hydroxy-3,5-dimethylphenyl)- 3-hydroxyphenyl methane, bis(4-hydroxy-3,5-dimethylphenyl)- 2-hydroxyphenyl methane, bis(4-hydroxy-2,5-dimethylphenyl)- 4-hydroxyphenyl methane, bis(4-hydroxy-2,5-dimethylphenyl)- 3-hydroxyphenyl methane, bis(4-hydroxy-2,5-dimethylphenyl)- 2-hydroxyphenyl methane, bis(4-hydroxy-3,5-dimethylphenyl)- 3,4-dihydroxyphenyl methane, bis(4-hydroxy- 2,5-dimethylphenyl)-3,4-dihydroxyphenyl methane, bis( 4-hydroxy-3,5-dimethylphenyl)-2,4-dihydroxyphenyl methane, bis( 4-hydroxy-2,5-dimethylphenyl)-2,4-dihydroxyphenyl methane, bis(4-hydroxyphenyl)-3-methoxy-4-hydroxyphenyl methane and the like.

Examples of suitable polyhydroxy compounds belonging to the fourth class include bis(cyclohexyl hydroxy phenyl)-hydroxyphenyl methane compounds such as bis(3-cyclohexyl-4-hydroxy phenyl)-3-hydroxyphenyl methane, bis(3-cyclohexyl-4-hydroxy phenyl)-2-hydroxyphenyl methane, bis(3-cyclohexyl-4-hydroxy phenyl)-4-hydroxyphenyl methane, bis(3-cyclohexyl- 4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxy phenyl)- 3-hydroxyphenyl methane, bis(3-cyclohexyl-6-hydroxy phenyl)- 4-hydroxyphenyl methane, bis(3-cyclohexyl-6-hydroxy phenyl)- 2-hydroxyphenyl methane, bis(3-cyclohexyl-6-hydroxy- 4-methylphenyl)-2-hydroxyphenyl methane, bis(3-cyclohexyl- 6-hydroxy-4-methylphenyl)-4-hydroxyphenyl methane, bis( 3-cyclohexyl-6-hydroxy-4-methylphenyl)-3,4-dihydroxyphenyl methane and the like.

Examples of suitable polyhydroxy compounds belonging to the fifth class include [(poly) hydroxyphenyl] alkane compounds such as 2-(2,3,4-trihydroxyphenyl)-2-(2',3',4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane, bis(2,4-dihydroxyphenyl) methane and the like.

Examples of suitable (poly)hydroxy compounds belonging to the sixth class include other hydroxy compounds than above such as phenol, 4-methoxy phenol, dimethyl phenols, hydroquinone, bisphenol A, naphthols, pyrocatechol, pyrogallol monomethyl ether, pyrogallol 1,3-dimethyl ether, gallic acid, partial esterification or etherification products of gallic acid and the like.

The (poly)hydroxy compound to be reacted with naphthoquinone- 1,2-diazide sulfonic acid to give an esterification product as the component (b) can be selected from the compounds of the above described first to sixth classes depending on the desired characteristics of the photoresist composition such as sensitivity, resolution of images, heat resistance and range of focusing depth.

Particularly preferable polyhydroxy compounds include 2,3,4-trihydroxy benzophenone and 2,3,4,4'-tetrahydroxy benzophenone belonging to the first class, 1-[1-(4-hydroxyphenyl) isopropyl]-4-[1,1-bis(4-hydroxyphenyl) ethyl] benzene belonging to the second class, bis(4-hydroxy-3,5-dimethylphenyl)- 2-hydroxyphenyl methane, bis(4-hydroxy-2,5-dimethylphenyl)- 2-hydroxyphenyl methane, bis(4-hydroxy-3,5-dimethylphenyl)- 3,4-dihydroxyphenyl methane, bis(4-hydroxy-2,5-dimethylphenyl)- 3,4-dihydroxyphenyl methane and bis(4-hydroxyphenyl)-3-methoxy-4-hydroxyphenyl methane belonging to the third class, bis(3-cyclohexyl-4-hydroxy-6-methylphenyl)-2-hydroxyphenyl methane, bis(3-cyclohexyl-4-hydroxy-6-methylphenyl)- 3-hydroxyphenyl methane, bis(3-cyclohexyl-4-hydroxy- 6-methylphenyl)-4-hydroxyphenyl methane and bis(3-cyclohexyl- 4-hydroxy-6-methylphenyl)-3,4-dihydroxyphenyl methane belonging to the fourth class and 2-(2,3,4-trihydroxyphenyl)-2-(2',3',4'-trihydroxyphenyl) propane, 2-(2,4-dihydroxyphenyl)-2-(2',4'-dihydroxyphenyl) propane and bis(2,3,4-trihydroxyphenyl) methane belonging to the fifth class.

The component (b) as the photosensitive ingredient in the inventive positive-working photoresist composition can be prepared by the full or partial esterification reaction in which a quinonediazido group-containing organic sulfonic acid such as, for example, a naphthoquinone-1,2-diazide-4- or -5-sulfonyl halide is subjected to a condensation reaction with a polyhydroxy compound, which is preferably a benzophenone compound, 1-[1-(4-hydroxyphenyl) isopropyl]-4-[1,1-bis( 4-hydroxyphenyl) ethyl] benzene, tris(hydroxyphenyl) methane compound, bis(cyclohexylhydroxyphenyl) hydroxyphenyl methane compound or [(poly)hydroxyphenyl] alkane compound. The esterification reaction is performed usually in a solvent capable of dissolving both of the reactants such as dioxane in the presence of a hydrogen halide acceptor such as triethanolamine, alkali carbonates and alkali hydrogen carbonates.

It is preferable that the degree of esterification in the above mentioned esterification product is at least 50% or, more preferably, at least 60% relative to the hydroxy groups in the starting polyhydroxy compound in respect of the improved resolution in the patterning with the photoresist composition. Namely, the esterification reaction of the polyhydroxy compound is performed with the naphthoquinone-1,2-diazide-4- or -5-sulfonyl halide in an amount of at least 50% by moles or, preferably, at least 60% by moles relative to the hydroxy groups in the polyhydroxy compound.

The amount of the component (b) in the inventive photoresist composition is usually in the range from 5 to 100% by weight or, preferably, from 10 to 50% by weight, based on the total amount of the alkali-soluble resin as the component (a) and the component (c) or the total amount of the component (a), the component (c) and other optional polyhydroxy compounds as described below. When the amount of the component (b) is too small, the patterned resist layer formed by using the photoresist composition is poor relative to the fidelity to the mask pattern affecting the quality of the reproduced images while, when the amount thereof is too large, a decrease is caused in the uniformity of the resist layer affecting the resolving power of the reproduced image.

In addition to the above described essential components (a) and (b), the photoresist composition of the invention contains a third essential ingredient as the component (c) which is a bis(cyclohexylhydroxyphenyl)-hydroxyphenyl methane compound represented by the general formula (I). This compound can be easily prepared according to a known method by the condensation reaction of a phenolic compound substituted by a cyclohexyl group and an aldehydes in the presence of an acidic catalyst. It is preferable that the component (c) is a compound of the general formula (I) in which the groups denoted by $R^1$ and $R^2$ are each a methyl group, $R^3$ and $R^4$ are each a hydrogen atom and the Cyclohexyl groups are bonded to the respective phenyl groups at the 3-position. More preferably, the subscripts a, b, u and v are each equal to 1.

Examples of the compound represented by the general formula (I) and suitable as the component (c) include the compounds belonging to the fourth class of the polyhydroxy aromatic compounds named as the esterification reactant to prepare the component (b), of which particularly preferable are bis(3-cyclohexyl-4-hydroxy-6-methylphenyl) 2-hydroxyphenyl methane, bis(3-cyclohexyl-4-hydroxy-6-methylphenyl) 3-hydroxyphenyl methane, bis(3-cyclohexyl-4-hydroxy-6-methylphenyl) 4-hydroxyphenyl methane, bis(3-cyclohexyl-4-hydroxy-6-methylphenyl) 3,4-dihydroxyphenyl methane and bis(3-cyclohexyl-6-hydroxy-4-methylphenyl) 3,4-dihydroxyphenyl methane. The last mentioned two compounds are the most preferable in respect of the high sensitizing effect on the photoresist composition compounded therewith as well as an improved resolution of the patterned resist layer formed therefrom. These compounds as the component (c) can be used either singly or as a combination of two kinds or more according to need.

The compound as the component (c) is characterized by the introduction of cyclohexyl groups into a trisphenol methane compound to exhibit a solubility-suppressing effect in an aqueous alkaline solution to the photoresist composition before exposure to actinic rays so as to improve the resolution of the patterned resist layer. A good balance between the solubility-suppressing effect by the cyclohexyl groups and the solubility-promoting effect by the hydroxy groups can be obtained when the compound has a plural number of hydroxy groups bonded to one and the same phenyl group as in bis(3-cyclohexyl-4-hydroxy-6-methylphenyl)-3,4-dihydroxyphenyl methane and bis(3-cyclohexyl-6-hydroxy-4-methylphenyl)- 3,4-dihydroxyphenyl methane so that the above mentioned advantages in the photosensitizing effect and resolution are more remarkable.

The amount of the above described component (c) in the inventive photoresist composition is in the range from 5 to 50% by weight or, preferably, from 10 to 35% by weight based on the amount of the component (a). When the amount of the component (c) is too small, the desired improvement by the addition of this ingredient cannot be fully obtained as a matter of course while, when the amount thereof is too large, adverse influences are caused on the sensitivity of the composition, resolution of the patterned images and orthogonality of the cross sectional profile of a line-patterned resist layer.

It is optional that the positive-working photoresist composition of the invention comprising the above described essential components (a), (b) and (c) is further admixed according to need with, as the component (d), an additional polyhydroxy compound selected from the group consisting of the compounds belonging to the second and third classes of the polyhydroxy aromatic compounds of the general formulas (II) and (III), respectively, used as a reactant in the preparation of the component (b) and the compounds represented by the general formula

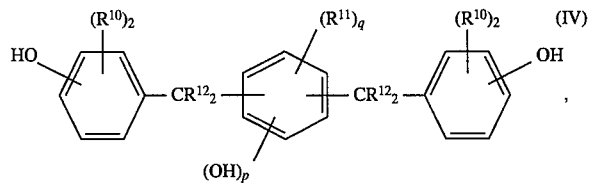

in which each $R^{10}$ is, independently from the others, a hydrogen atom, halogen atom, hydroxy group, alkyl group having 1 to 4 carbon atoms, alkoxy group having 1 to 4 carbon atoms or alkenyl group having 2 to 4 carbon atoms, each $R^{11}$ is, independently from the others, a hydrogen atom, halogen atom or alkyl group having 1 to 4 carbon atoms, each $R^{12}$ is, independently from the others, a hydrogen atom or alkyl group having 1 to 4 carbon atoms, the subscript p is 0, 1, 2 or 3 and the subscript q is 1, 2 or 3 with the proviso that p+q does not exceed 4. When these additional polyhydroxy aromatic compounds are added to the composition, total of the amount thereof and the amount of the component (c) is in the range from 5 to 50% by weight or, preferably, from 10 to 35% by weight based on the amount of the component (a).

The compounds represented by the general formula (II) include 1-[1-(4-hydroxyphenyl) isopropyl]-4-[1,1-bis(4-hydroxyphenyl) ethyl] benzene, 1-[1-(3-methyl- 4-hydroxyphenyl) isopropyl]-4-[1,1-bis(3-methyl- 4-hydroxyphenyl) ethyl] benzene and the like.

The compounds represented by the general formula (III) include bis(4-hydroxy-3,5-dimethylphenyl)-3,4-dihydroxyphenyl methane, bis(4-hydroxy-2,5-dimethylphenyl)-2-hydroxyphenyl methane, bis(4-hydroxy-3,5-dimethylphenyl)-2-hydroxyphenyl methane, bis(4-hydroxy-2,6-dimethylphenyl)-4-hydroxyphenyl methane and the like.

The compounds represented by the general formula (IV) include 2,6-bis[1-(2,4-dihydroxyphenyl) isopropyl]-4-methyl phenol, 1,3-dihydroxy-4,6-bis[1-(4-hydroxyphenyl) isopropyl] benzene, 1,2,3-trihydroxy-4,6-bis[(4-hydroxy-3,5-dimethoxyphenyl) methyl] benzene, 1-hydroxy-4-methyl-2,6-bis[( 2,4-dihydroxy-5-methylphenyl) methyl] benzene, 1,2,3-trihydroxy- 4,6-bis[(4-hydroxy-3,5-dimethylphenyl) methyl] benzene, 1-hydroxy-4-methyl-2,6-bis[(2,3,4-trihydroxyphenyl) methyl] benzene and the like.

It is of course further optional that the photoresist composition of the invention is admixed with various kinds of known additives conventionally used in photoresist compositions having miscibility with the above described essential components including auxiliary resins to improve the film-formability of the composition, plasticizers, stabilizers, coloring agents to improve the visibility of the patterned resist layer and so on each in a limited amount.

The positive-working photoresist composition of the present invention can be prepared by dissolving the above described essential and optional ingredients uniformly in a suitable organic solvent. Examples of suitable organic solvents include ketones such as acetone, methyl ethyl ketone, cyclohexanone and methyl isoamyl ketone, polyhydric alcohols and derivatives thereof such as ethyleneglycol, propyleneglycol, diethyleneglycol, ethyleneglycol monoacetate, propyleneglycol monoacetate, diethyleneglycol monoacetate, dipropyleneglycol and dipropyleneglycol monoacetate as well as monomethyl, monoethyl, monopropyl, monobutyl and monophenyl ethers thereof, cyclic ethers such as dioxane, and esters such as ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

The procedure of the photolithographic patterning work using the inventive positive-working photoresist composition can be performed according to a conventional method. For example, a substrate such as a semiconductor silicon wafer is uniformly coated with the inventive photoresist composition in the form of a solution by using a suitable coating machine such as spinners followed by drying to form a photosensitive resinous layer which is then pattern-wise irradiated with actinic rays by the exposure to ultraviolet light emitted from low-, high- and ultrahigh-pressure mercury lamps, arc lamps and xenon lamps through a patterned photomask or with electron beams under pattern-wise scanning to form a latent image in the resinous layer. The thus formed latent image can be developed by dipping in a weakly alkaline aqueous solution such as a 1 to 10% by weight aqueous solution of tetramethyl ammonium hydroxide so as to dissolve away the resinous layer in the exposed areas leaving a patterned resist layer in the unexposed areas which is a reproduction of the photomask pattern with high fidelity.

In the following, the positive-working photoresist composition of the invention is illustrated in more detail by way of examples, which, however, never limit the scope of the invention in any way. In the following examples and comparative examples, in which the term of "parts" always refers to "parts by weight", the positive-working photoresist compositions prepared therein were evaluated for the following items by the testing procedures respectively described there.

1. Photosensitivity:

A semiconductor silicon wafer was uniformly coated with the photoresist composition by using a spinner followed by drying on a hot plate at 90° C. for 90 seconds to form a resist layer having a thickness of 1.05 μm. The photoresist layer was pattern-wise exposed to ultraviolet light on a minifying projection-exposure machine (Model NSR-1755i7B, manufactured by Nikon Co., NA=0.54) for an exposure time of 0.1 second and stepwise increased exposure times with 0.01 second increments followed by a post exposure bake treatment at 110° C. for 90 seconds and a development treatment in a 2.38% by weight aqueous solution of tetramethyl ammonium hydroxide at 23° C. for 65 seconds to dissolve away the resist layer in the exposed areas, rinse in a stream of running water for 35 seconds and drying to give a patterned resist layer on the substrate surface. The minimum exposure time, by which the resist layer in the exposed areas could be dissolved away completely, was recorded as a measure of the photosensitivity of the composition.

2. Resolution:

Recording was made of the critical resolution at an exposure dose by which a 0.40 μm width line-and-space pattern of the photomask could be reproduced.

3. Heat resistance:

A line-and-space patterned resist layer of 5 μm line width was formed on a silicon wafer and heated for 5 minutes on a hot plate at 125° C., 130° C., 135° C. or 140° C. to record the lowest temperature at which deformation was found in the patterned resist layer.

4. Cross sectional profile of line pattern:

A line-and-space patterned resist layer of 0.35 μm line width was formed on a silicon wafer and the cross sectional profile of the patterned line was examined on a scanning electron microscope to record the results in two ratings of: A for an orthogonal profile and B for a trapezoidal profile.

5. Range of focusing depth:

Taking the exposure dose with which a resist layer of a line-and-space pattern of 0.40 μm line or space width, i.e. Eop, was formed on a silicon wafer in a 1:1 (line width-):(space width) ratio by using the minifying projection exposure machine as the base exposure dose, exposure tests were undertaken at the Eop with a slight up or down shift of the focusing point followed by development. The cross sectional profile of the thus formed resist layer of the line-and-space pattern was examined on a scanning electron microscope and records were made of the largest range of the shift in the focusing point, by which an orthogonal cross sectional profile of 0.40 μm width could be obtained, as the range of focusing depth.

Example 1.

A cresol novolac resin was prepared from a mixture of m-cresol and p-cresol in a weight ratio of 40:60 and formalin in a conventional manner with oxalic acid as the catalyst. The thus prepared novolac resin was subjected to a fractionation treatment to remove the low molecular weight fractions so that the resin after fractionation had a weight-average molecular weight of 6000.

A photoresist composition was prepared by uniformly dissolving:
(i) 100 parts of the above prepared cresol novolac resin;
(ii) 34 parts of an esterification product from 1.0 mole of bis(4-hydroxy-3,5-dimethylphenyl)-2-hydroxyphenyl methane and 2.8 moles of naphthoquinone-1,2-diazide-5-sulfonyl chloride; and
(iii) 30 parts of bis(3-cyclohexyl-4-hydroxy-6-methylphenyl)- 3,4-dihydroxyphenyl methane;
in 350 parts of ethyl lactate followed by filtration of the solution through a membrane filter of 0.2 μm pore diameter.

This photoresist composition was subjected to the evaluation tests for the above described items to give the results shown in Table 1 below.

Comparative Example 1.

The experimental procedure was just the same as in Example 1 except that 25 parts of bis(4-hydroxy- 3,5-dimethylphenyl)-2-hydroxyphenyl methane were used instead of 30 parts of bis(3-cyclohexyl-4-hydroxy-6-methylphenyl)- 3,4-dihydroxyphenyl methane in the preparation of the photoresist composition.

The results of the evaluation tests for this photoresist composition are shown in Table 1.

Comparative Example 2.

The experimental procedure was just the same as in Example 1 except that the bis(3-cyclohexyl-4-hydroxy-6-methylphenyl)-3,4-dihydroxyphenyl methane was replaced with the same amount of bis(4-hydroxy-3-methylphenyl)-3,4-dihydroxyphenyl methane in the preparation of the photoresist composition.

The results of the evaluation tests for the photoresist composition are shown in Table 1.

Comparative Example 3.

The experimental procedure was just the same as in Example 1 except that the bis(3-cyclohexyl-4-hydroxy-6-methylphenyl)-3,4-dihydroxyphenyl methane was replaced with the same amount of 1-[1-(4-hydroxyphenyl) isopropyl]- 4-[1,1-bis(4-hydroxyphenyl) ethyl] benzene in the preparation of the photoresist composition.

The results of the evaluation tests for the photoresist composition are shown in Table 1.

TABLE 1

| | | Photo-sensi-tivity ms | Re-solu-tion, μm | Heat resis-tance, °C. | Cross sec-tional profile | Range of focusing depth, μm |
|---|---|---|---|---|---|---|
| Example | 1 | 200 | 0.35 | 140 | A | 1.2 |
| Compa- | 1 | 200 | 0.38 | 140 | B | 1.0 |
| rative | 2 | 150 | 0.38 | 135 | B | 0.8 |
| Example | 3 | 190 | 0.38 | 140 | B | 1.0 |

What is claimed is:

1. A positive-working photoresist composition which comprises, as a uniform mixture:

(a) an alkali-soluble resin;
   (b) a quinonediazide group-containing compound; and
   (c) a cyclohexyl-substituted triphenylmethane compound represented by the formula

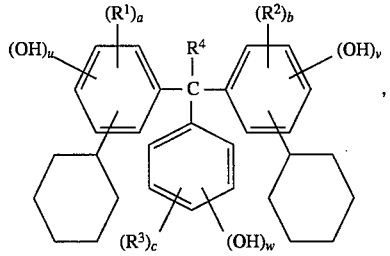

in which $R^1$, $R^2$ and $R^3$ are each a hydrogen atom, alkyl group having 1 to 3 carbon atoms or alkoxy group having 1 to 3 carbon atoms, $R^4$ is a hydrogen atom or alkyl group having 1 to 3 carbon atoms and the subscripts a, b, c, u, v and w are each 1, 2 or 3 with the provisos that a+u and b+v each do not exceed 4 and c+w does not exceed 5, in an amount in the range from 5% to 50% by weight based on the amount of component (a) in the composition and the amount of component (b) is in the range of from 5 to 100% by weight based on the total amount of components (a) and (c).

2. The positive-working photoresist composition as claimed in claim 1 in which the groups denoted by $R^1$ and $R^2$ are each a methyl group.

3. The positive-working photoresist composition as claimed in claim 1 in which the groups denoted by $R^3$ and $R^4$ are each a hydrogen atom.

4. The positive-working photoresist composition as claimed in claim 1 in which the cyclohexyl groups are bonded each to the respective phenyl group at the 3-position thereof.

5. The positive-working photoresist composition as claimed in claim 1 in which the subscripts a, b, u and v are each equal to 1.

6. The positive-working photoresist composition as claimed in claim 1 in which the subscript w is 2 to give two hydroxy groups OH which are bonded to the phenyl group at the 3- and 4-positions thereof.

7. The positive-working photoresist composition as claimed in claim 1 in which component (a) is an alkali-soluble novolac resin.

8. The positive-working photoresist composition as claimed in claim 1 in which component (c) is bis(3-cyclohexyl- 4-hydroxy-6-methylphenyl)-3,4-dihydroxyphenyl methane or bis( 3-cyclohexyl-6-hydroxy-4-methylphenyl)-3,4-dihydroxyphenyl methane.

9. The positive-working photoresist composition as claimed in claim 1 in which component (b) is an esterification product of a quinonediazido group-containing organic sulfonic acid and a polyhydroxy compound.

10. The positive-working photoresist composition as claimed in claim 9 in which the quinonediazido group-containing organic sulfonic acid is a naphthoquinone-1,2-diazide sulfonic acid.

11. The positive-working photoresist composition as claimed in claim 9 in which the polyhydroxy compound is selected from the group consisting of 1-[1-(4-hydroxyphenyl) isopropyl]- 4-[1,1-bis(4-hydroxyphenyl) ethyl] benzene, tris(hydroxyphenyl) methane compounds, bis(cyclohexyl hydroxy phenyl)-hydroxyphenyl methane compounds and alkane compounds.

* * * * *

UNITED STATES PATENT AND TRADEMARK OFFICE
CERTIFICATE OF CORRECTION

PATENT NO. : 5,501,936
DATED : March 26, 1996
INVENTOR(S) : Hiroshi HOSODA et al.

It is certified that error appears in the above-indentified patent and that said Letters Patent is hereby corrected as shown below:

IN THE CLAIMS:

Column 12:
Claim 11, last line, before "alkane" insert

--[(poly)hydroxyphenyl]--.

Signed and Sealed this

Twenty-fifth Day of June, 1996

Attest:

BRUCE LEHMAN

Attesting Officer   Commissioner of Patents and Trademarks